LOW-LEVEL AUTOMATIC GAIN CONTROL CIRCUITRY

Filed May 14, 1965

2 Sheets-Sheet 1

INVENTOR
W. J. BROWN
BY E. J. Olinder
ATTORNEY

United States Patent Office 3,368,158
Patented Feb. 6, 1968

3,368,158

LOW-LEVEL AUTOMATIC GAIN CONTROL CIRCUITRY

William J. Brown, Brielle, N.J., assignor to Bell Telephone Laboratories, Incorporated, New York, N.Y., a corporation of New York Filed May 14, 1965, Ser. No. 455,714
15 Claims. (Cl. 330—28)

This invention relates to electronic amplifiers and more particularly to an amplifier which enhances input signals of normal level while suppressing input signals of low levels.

Numerous circuits exist which achieve gain control or discrimination by use of non-linear elements including diodes or variolossers which vary the loss in, or operating point of, one or more active devices within the amplifier proper. This action is achieved, typically, by applying an active control voltage to the non-linear elements, derived from any convenient source within the circuit or outside, to vary the impedance in a feedback loop. One such arrangement is illustrated in Patent 3,023,369, issued to I. Horowitz on Feb. 27, 1962.

Prior art teachings have not, however, supplied wholly satisfactory solutions to a number of persistent, interrelated gain control problems. For example, where only a relatively low supply voltage is available, it is difficult to develop the signal voltages necessary to operate the non-linear elements at impedances compatible with transistor amplifiers and still achieve a desired sensitive discrimination. Also, cost and some operating considerations suggest the elimination, where possible, of the normally necessary external control circuit. Additionally, in many applications it is desirable to achieve a constant attenuation level for signals below a predetermined value. Such suppression of low level signals, especially in response to very small decreases in input signal level, is difficult to produce in low cost transistor circuitry, given the low level input signals referred to.

An important illustration of a situation to which all these considerations apply is a lightweight operator's headset employing, for example, a reluctance microphone and an associated transistor amplifier in place of the widely-used but objectionably heavy carbon transmitter. Any acceptable replacement of the latter must suppress background noise and crosstalk between adjacent operator positions, which the carbon microphone does naturally; and, importantly, must have input and output impedance characteristics compatible with existing operators' circuits.

More specifically, the maximum output of such an amplifier may be no more than 1 volt, and it may be required to operate linearly for a range of about 20 db below 1 volt, i.e., at a signal level of 0.1 volt, or less. If in addition, a low level non-linear characteristic is desired, conventional direct application of non-linear materials such as silicon, germanium, copper oxide, and so forth, is not satisfactory since devices of this type generally become conductive at about 0.5 volt.

Accordingly, an object of the invention is to secure an acceptably low acoustic crosstalk level between adjacent operators' positions at telephone switchboards.

A further object of the invention is to achieve a self-acting discriminator circuit that will operate with very low supply voltages to vary automatically the gain of an associated amplifier circuit.

A further object of the invention is to simulate the input-output characteristics of standard carbon transmitter microphones.

Another object of the invention is to control the impedance of a transistor emitter-to-base feedback loop directly by the amplitude of an AC signal applied to its base.

These and other objects are achieved in accordance with the principles of the invention by an electronic amplifier in which feedback is adjusted by variations of the impedance of a feedback loop in response to internally-derived signals applied through a transformer to a non-linear network whose impedance varies sharply with relatively small applied signal changes.

In accordance with one aspect of the invention, a bypass path around the feedback impedance comprises a capacitor and the primary winding of a high turns-ratio transformer. Across the secondary are two unidirectionally conductive devices, such as silicon diodes which are oppositely poled, and a resistor. The latter is not essential to the operation of the circuit. At normal input levels the devices conduct heavily enough so that the equivalent series impedance in the secondary loop is low and is seen by the primary loop as essentially a short circuit. This places the negative side of a bypass capacitor at ground potential, and an AC bypass of the feedback impedance element is produced. At and below a preselected low input signal level, the devices are completely non-conducting and the resistor in the secondary loop is therefore no longer shunted. With appropriate choice of resistance value and turns-ratio, an impedance is now produced in the primary winding, and the resulting impedance produces negative feedback which attenuates low level input signals. Between the mentioned conductive states of the unidirectional devices, the low level signal attenuation varies in accordance with the current in the devices.

The feedback results from the non-constant effective value of the impedance of the feedback network, achieved in accordance with the invention, with very low input voltages such as .05 volt through the combined action of the transformer and the non-linear elements. The discriminator elements may be placed directly in series with the amplifier signal path, or may operate essentially in parallel with the main signal path. When employed in a transistor amplifier, the referred-to feedback path typically is between the emitter and base of a given stage.

Accordingly, a feature of the invention resides in a non-linear circuit which varies the impedance of a feedback path directly from the amplitude of an AC signal at said base.

A second feature of the invention relates to an amplifier having a highly sensitive discriminator circuit including unidirectionally conductive non-linear elements paralleled with the secondary of a high turns-ratio transformer which decreases the impedance of a negative feedback loop in response to very small decreases of a low voltage input signal to the amplifier.

These and other objects and features of the invention will be more fully apprehended from the description to follow of two illustrative embodiments thereof, and from the accompanying drawing in which.

The inventive principles are particularly described and demonstrated below in a typical embodiment involving the aforementioned telephone operator's headset and associated transistor amplifier.

Figures 1, 2:
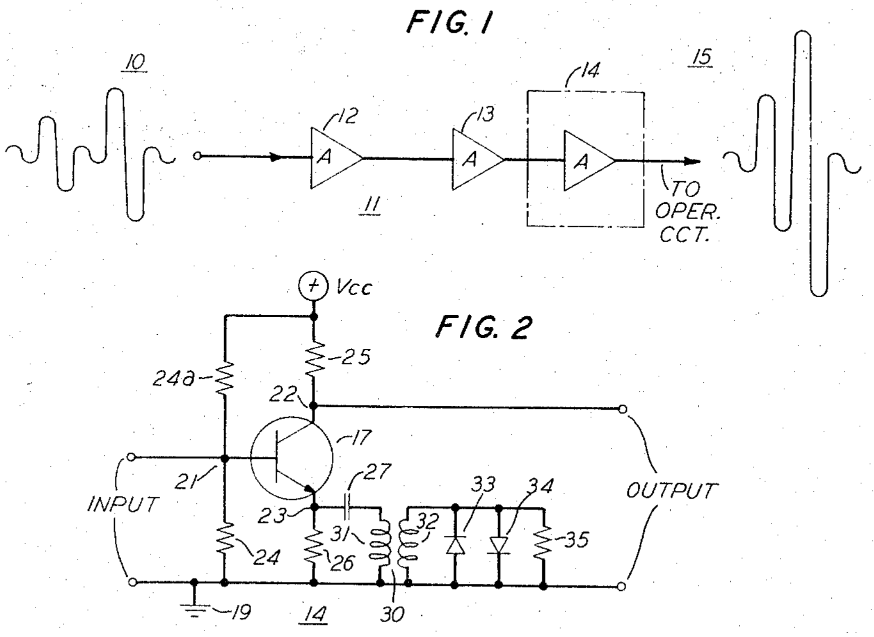
FIG. 1 is a block diagram of a first amplifier.
FIG. 2 is a circuit schematic diagram showing a control stage.

FIG. 1 portrays diagrammatically an input signal 10 to an amplifier designated generally as 11 which has an output 15 connected to an operator's circuit (not shown). Amplifier 11 may consist of several gain stages 12, 13, 14, one of which, for example, 14, contains the control network in accordance with the invention.

In FIG. 2, the control network stage 14 is shown schematically and includes an NPN transistor 17 connected in common-emitter configuration. Transistor 17 may be arranged in some other configuration, however, and may equally well be of the PNP type. Of course, a vacuum tube element such as a triode may be substituted for transistor 17 since the principle to be described is equally applicable to any of them and, in fact, to any circuit which relies upon a variation of feedback to achieve discrimination. The input from a previous stage or from an electroacoustic device (not shown) is applied to base terminal 21 of transistor 17; and the output is taken from collector terminal 22, the emitter circuit being common to both input and output. Base biasing is provided through resistors 24 and 24*a* and collector bias is applied through any convenient means from a source $V_{cc}$ through a resistor 25. Circuit ground is shown at 19.

A feedback loop exists between emitter 23 and base 21 through emitter resistor 26. An emitter resistor bypass path is defined by capacitor 27 and the primary 31 of a transformer 30. In accordance with standard negative feedback principle, some fraction (Beta) of the voltage at the emitter is applied through the feedback loop to the base where, because of the natural inversion, it attenuates the input voltage signal. Beta is a function of the impedance between emitter and ground. The higher this impedance, the greater is the AC voltage drop across it and accordingly the greater the feedback applied to the base. When the emitter-to-ground impedance is low or close to zero, no feedback voltage is generated.

The secondary winding 32 of transformer 30 contains one or two orders of magnitude more turns than primary winding 31. A series loop is defined by connections between secondary 32 and, optionally, a resistor 35. A pair of unidirectionally conductive devices 33 and 34 whose impedance varies non-linearly and inversely with applied voltage, for example, copper oxide varistors or diodes, (vacuum tube, silicon or germanium) are reverse-poled and connected in parallel with each other and with resistor 35. The turns-ratio of transformer 30 and the characteristics for devices 33, 34 are selected to cause the devices to conduct heavily at and above some point in the linear operating range of transistor 17. This point is reached, of course, when the input signal voltage level applied to base terminal 21 achieves a certain preselected value. When the devices so conduct, the impedance across secondary winding 32 is very low. This low impedance is reflected back to primary 31 as essentially a short circuit, placing the negative side of bypass capacitor 27 at ground potential. The entire AC output therefore bypasses emitter resistor 26 and no degenerative feedback is produced.

Whenever the instantaneous input signal voltage drops below a preselected level, corresponding to the level of operator crosstalk and ambient background noise to be suppressed, insufficient voltage occurs across diodes 33, 34 and each becomes non-conducting in the forward direction. Since neither diode conducts in the reverse direction in any case, resistor 35 is no longer shorted. Primary 31 now sees at least some impedance, the value of which depends upon the magnitude of resistor 35. Accordingly, as long as the instantaneous input signal level remains below the preselected value, impedance from emitter to ground exists, the magnitude of which is the equivalent of the parallel combination of resistor 26 and the instantaneous impedance of primary 31. Instantaneously, therefore, negative feedback is produced which suppresses the incoming signal as long as the latter remains below the mentioned preselected value.

Because of the low impedance of the emitter circuit, primary 31 can have a very low value of inductance and therefore relatively few turns and still reduce by degeneration the gain of the amplifier stage an appreciable amount, e.g., 12 db or more. A very high step-up in voltage can be obtained without having excessively high impedance in secondary 32. Also, high current is not required to drive the impedance of the non-linear device employed to a low value, since the high-turns ratio of transformer 30 reduces the impedance of the non-linear device exponentially, e.g., by 10,000 if the turns ratio is 100.

Figure 3:
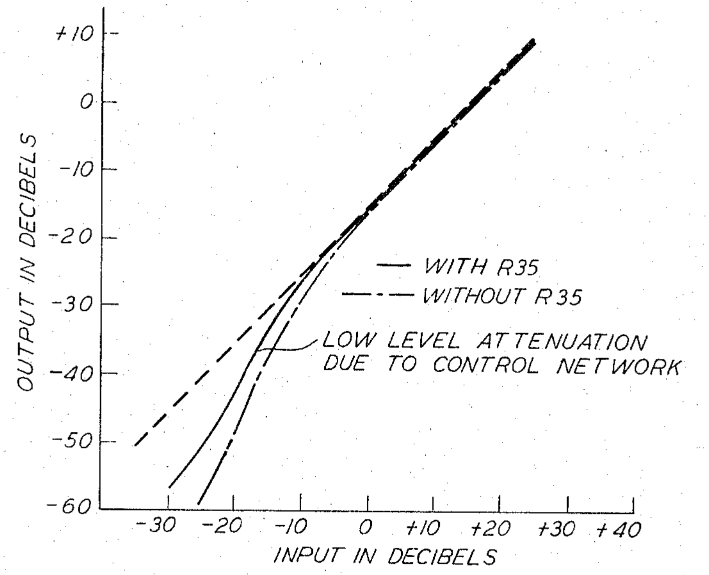
FIG. 3 is a graph of input versus output for the first amplifier.

FIG. 3 shows typical input-output characteristics of an amplifier employing the inventive control network. Both scales are in decibels, the ordinate being input from a transmitter impedance source and the output being to a resistance across a two-line operator's circuit 1.12 millivolts input is taken as 0 db; and 1.0 volt output is taken as 0 db. The linear region shown in solid line represents a typical multistage amplifier which includes a CE stage in which no impedance is present in an emitter-to-base feedback loop. A dotted line in FIG. 3 shows the characteristics for the same amplifier in which the CE stage includes the control circuit of the instant invention. A broken line shows the curve resulting when resistor 35 is left out. When employed, in accordance with a further aspect of the invention, resistor 35 reduces distortion at low signal levels and limits the amount of attenuation.

The discriminator circuit may also be used as a series element between a common collector amplifier stage and a further amplifier stage. In this arrangement, primary 31 would appear in series between the output of the common collector stage and the input of the next stage.

Figure 4:
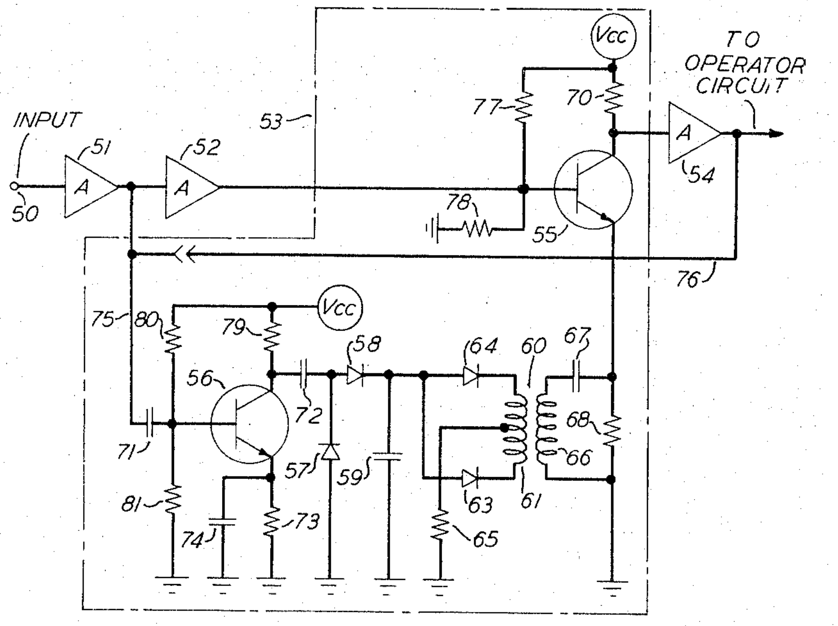
FIG. 4 is a block diagram and partial-circuit schematic of a second amplifier.

Instead of deriving the control signal from the base or input of the very stage in which it is employed as just described, the signal may, in accordance with another aspect of the invention, be derived from the output of a different amplification stage in a manner illustrated diagrammatically in FIG. 4 as an example. As shown therein, an input 50 is fed to amplification stages 51 and 52, thence to control stage designated generally as 53 and finally through an output stage 54 to an operator circuit. In the embodiment now to be described, the principles of the invention are applied to a circuit for the purposes of achieving an automatic gain control. Control stage 53 includes a transistor 55 which is in the amplifier signal path, and corresponds generally to transistor 17 of the previously described embodiment. Stage 53 also includes, however, a second transistor 56 which derives its input from the output of a different stage, say stage 51. The signal so amplified is fed to capacitor 59 and rectified by elements 57 and 58, which may be silicon diodes. The rectified signal charges capacitor 59, which is in parallel with a secondary winding 61 of a transformer 60. The secondary winding 61 is part of a non-linear impedance series network that includes a pair of oppositely-poled devices 63 and 64 (similar to devices 33 and 34 of FIG. 2) which advantageously may be silicon diodes. Secondary winding 61 of transformer 60 has substantially more turns than primary 66. Primary 66 is parallel-coupled through a capacitor 67 to emitter resistor 68 of transistor 55 which is connected in common-emitter configuration. When not bypassed, resistor 68 supplies impedance for conventional negative feedback.

As long as the AGC voltage across capacitor 59 is too low to cause appreciable conduction in diodes 63 and 64, winding 61 of transformer 60 is essentially open-circuited. An open circuit at winding 61 is, of course, an open circuit also at primary 66 with the result that, with low AGC voltage, emitter resistor 68 is not bypassed. Degenerative feedback is thereby produced and the gain of the entire amplifier is minimum. When the AGC voltage across capacitor 59 causes diodes 63 and 64 to conduct, these diodes appear as a low resistance across the winding 61 which is reflected to winding 66 in proportion to the impedance ratio. By selecting an appropriate turns ratio, the resistance reflected to winding 66 can be made very low, which essentially grounds the negative lead of capacitor 67 and produces an AC bypass path around resistor 68. The degenerative feedback previously produced by a potential across resistor 68 is now eliminated and the amplifier gain is maximum. In the area of operation which the diodes 63 and 64 are either not conducting significantly or are conducting substantially, their resistance is dependent on the current through them. Accordingly, the change in amplifier gain is not abrupt but depends in a non-linear manner on the voltage across capacitor 59.

Element 70 and elements 77 through 81, inclusive, external to transistors 55 and 56 are all conventional biasing resistors fed from potentials $V_{cc}$. Elements 71 and 72 are blocking capacitors. Element 73 is an emitter resistor of transistor 56 which is AC-bypassed through capacitor 74.

Shown also in FIG. 4 are two possible input paths to the AGC circuit. When the control signal is derived from a previous stage output as shown by solid line path 75, the action is non-regenerative. When the control signal is derived from a subsequent stage output as shown by dotted line path 76, the action is regenerative. In the latter case, the amplifier gain achieved by virtue of the novel control network can be made to change abruptly at a level set by the gain of transistor 56. The signal to the AGC circuit from the output of the amplifier increases as the AGC circuit increases the amplifier gain. Also, since the signal to the AGC circuit decreases as soon as the amplifier gain begins to decrease, the latter is caused to change abruptly from maximum to minimum value. In effect, a regenerative action can be made to occur, which makes the amplifier gain bistable.

In the illustrative embodiment shown in FIG. 4, the AGC action is delayed by the time required to charge or discharge capacitor 59. Release time of capacitor 59 may be controlled by the magnitude of a resistor 65 which is in an optional path to ground from a center tap 69 of winding 66. By proper selection of capacitor 59 and resistor 65, short duration noise bursts in the output may be eleminated while the amplifier gain is held at its normal value between words and speech syllables. Finally, distortion introduced by the AGC circuit is negligible since diodes 63 and 64 are never reverse-biased and switching transients therefore do not occur. Since the controlling current to these signals is DC current the non-linear resistance of the diodes is not a significant source of distortion. In these preceding respects therefore, the two embodiments of the inventive principle herein described differ, although the principle itself is seen to be the same.

Figure 5:
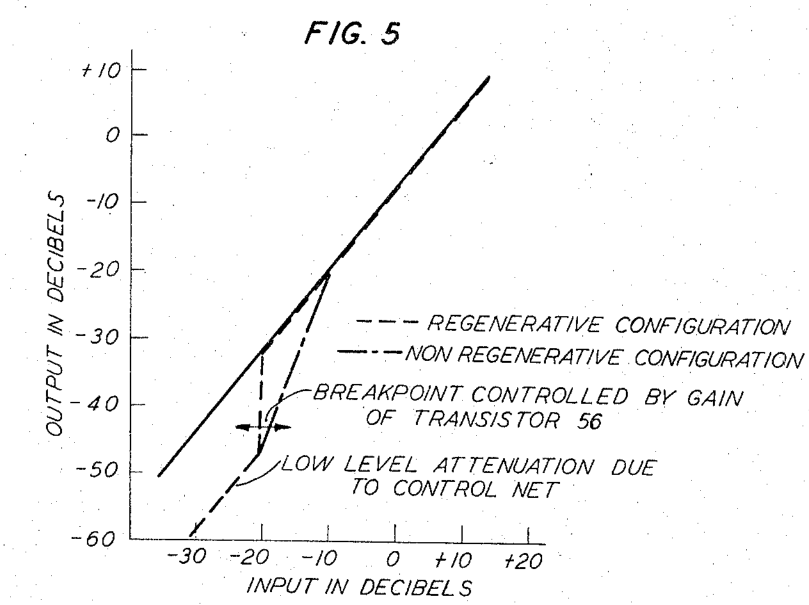
FIG. 5 is a graph of input versus output for the latter.

FIG. 5 portrays the input-output characteristics of the circuit shown in FIG. 4.

Persons skilled in the art may achieve numerous modifications of the control circuitry herein described without departing from the spirit and the scope of the invention.

What is claimed is:

1. An AC signal amplifier comprising, in combination, an active element having input and output electrodes, means including said element responsive to an input signal to said amplifier for generating a control signal proportional to said input signal, coupling means including a first portion and a second portion for effecting a voltage step-up therebetween, a feedback loop including at least one resistive element connecting said input and output electrodes, first circuit means including a capacitive circuit element and said first coupling portion in series relation connected in shunt relation to said feedback loop, and second circuit means including said second coupling portion responsive to said control signal for inducing a non-constant impedance in said first coupling portion, said impedance varying from substantially zero for magnitudes of input signals above a preselected level to relatively high impedance values for said input signals below said preselected level, whereby feedback signals are generated to attenuate only those input signals below said preselected level.

2. An AC amplifier comprising, in combination, an active element having input and output electrodes, means including said element responsive to an input signal applied to said input electrode for generating a control signal, a step-up transformer including a primary and a secondary, a feedback loop including at lest one resistive element connecting said input and said output electrodes, first circuit means including a capacitive circuit element and said primary in series relation connected in shunt relation to said feedback loop, and second circuit means including said secondary and having a non-linear impedance characteristic that varies inversely with applied voltage, said second circuit means being responsive to said control signal for reflecting a magnitude of impedance into said first circuit means, said impedance varying from a value of substantially zero for values of input signals above a preselected level to relatively high impedance values for said input signals below said preselected level, whereby feedback signals are generated in said feedback loop and in said first circuit means to attenuate only input signals which generate control signals below said preselected level.

3. In a multistage amplifier, a suppressor circuit comprising, in combination, a feedback loop including a resistive element, said loop being connected between the output and the input of a selected one of said amplifier stages, a step-up transformer having a primary and a secondary winding, said primary being connected in shunt relation with said resistive element, means including said selected amplifier stage responsive to input signals to said multistage amplifier for generating a control signal directly proportional to said input signals and for applying said control signal to said primary, said control signal being impressed onto said secondary, and means including said secondary and a non-linear impedance network connected therewith responsive to said control signal for reflecting a varying impedance to said primary, said impedance varying from essentially zero for said control signals above a preselected level to a substantial impedance value for said control signals below said preselected level, said zero impedance value producing a short across said resistive element and said substantial impedance value producing a voltage across said element, whereby feedback voltage is produced to suppress all input signals which generate said control signals below said preselected level.

4. In an amplifier, in combination, a transistor having base, emitter and collector electrodes, a signal input circuit connected to said base electrode and an output circuit connected between said emitter and collector electrodes, a negative feedback loop including at least one resistive element, said loop being connected between said emitter and base electrodes, a step-up transformer having a low-turns primary winding and a high-turns secondary winding, first circuit means incuding a capacitive element and said primary in series relation connected in shunt relation with said resistive element responsive to input signals to said base for generating a fluctuating voltage across said primary, and second circuit means including said secondary and a variable impedance network in shunt relation therewith responsive to said voltage fluctuations in said primary for producing a varying impedance in said secondary and a reflected impedance in said primary, said reflected impedance varying from zero for said input signals above a preselected level to a substantial impedance value for said input signals below said preselected level, said zero impedance value producing a short across said resistive element and said substantial impedance value producing a voltage across said element, whereby feedback voltage is produced to suppress all input signals which generate said control signals below said preselected level.

5. An amplifier in accordance with claim 4 wherein said variable impedance network comprises a pair of reversely-poled unidirectionally conductive devices, the impedance of which varies nonlinearly and inversely with applied voltage, said devices being connected in shunt relation with each other and with said secondary.

6. An amplifier in accordance with claim 5 wherein said variable impedance network further comprises means including a resistive element in shunt relation with said devices responsive to said input signals above said preselected level for maintaining a predetermined minimum value of impedance in said network thereby to limit said suppression.

7. An amplifier in accordance with claim 6 wherein said devices are unbiased silicon diodes.

8. On AC amplifier comprising, in combination, a transistor having base, emitter and collector electrodes connected in common emitter configuration, a step-up transformer including a low-turns primary and a high-turns secondary, means including said transistor responsive to input signals applied to said base electrode for generating a varying control signal, a feedback loop including a resistive element connecting said emitter and said base electrodes, first circuit means including a capacitive circuit element and said primary in series relation connected in shunt relation to said resistive element, and second circuit means including said secondary and a pair of oppositely-poled unidirectionally conductive devices in shunt relation with each other and with said secondary, said second circuit means being responsive to said control signals for inducing a varying impedance in said primary, said impedance ranging from substantially zero for values of said control signal above a preselected level to relatively high impedance values for said control signals below said preselected level, whereby feedback signals are produced to attenuate only those input signals which generate control signals having values below said preselected level.

9. An amplifier in accordance with claim 8 wherein said unidirectionally conductive devices are unbiased silicon diodes and wherein said second circuit means further includes a resistive element in shunt relation with said secondary whereby distortion at low signal levels is reduced.

10. In an electronic amplifier having AC input and output signals and a plurality of gain stages, a selected one of said stages having a feedback loop including a resistor, means for attenuating AC input signals in and below a specified range of amplitudes comprising, in combination, a transformer having a low-turns primary and a high-turns secondary, means for deriving a control signal from within said amplifier, said signal having a magnitude proportional to said AC input signal, means for applying said control signal to said secondary, a bypass path around said feedback loop resistor comprising a capacitive circuit element and said primary, and a variable impedance network comprising said secondary and a pair of unidirectionally conductive devices whose impedance varies non-linearly and inversely with applied voltage connected across said secondary, said devices being fully conductive in response to control signals above a selected range of values and non-conductive in response to control signals below said range, whereby the impedance in said secondary varies between low and substantially high values as said control signal falls across said range and the impedance reflected to said primary thereby varies from essentially zero for which no feedback occurs to a value sufficient to develop feedback for attenuation of AC input signal amplitudes in and below said specified range.

11. In a multiple stage amplifier including a junction transistor having a base, an emitter and a collector, an alternating input signal circuit connected between said base and said emitter and an output signal circuit connected between said collector and said emitter, means for attenuating AC input signals to said amplifier in and be low a specified range of amplitudes comprising, in combination, a feedback loop including a resistor connected between said emitter and said base, a transformer having a high-turns secondary and a low-turns primary, means for deriving a control signal form within said amplifier, said signal having a magnitude proportional to said AC input signal, means for applying said control signal to said secondary, a bypass path around said feedback loop resistor comprising a capacitive circuit element and said primary, a variable impedance network comprising said secondary and a pair of unidirectionally conductive devices whose impedance varies non-linearly and inversely with applied voltage, said devices being connected across said secondary and being fully conductive in response to control signals above a selected range of values and non-conductive in response to control signals below said range, whereby the impedance in said secondary varies between low and substantially high values as said control signal falls across said range and the impedance reflected to said primary thereby varies from essentially zero for which no feedback occurs to a value sufficient to develop feedback for attenuation of said AC input signal amplitudes in and below said specified range.

12. An amplifier in accordance with claim 11 wherein said unidirectionally conductive devices are oppositely-poled unbiased silicon diodes, each connected in shunt relation with said secondary and wherein said network further includes a resistive element connected in shunt relation with said diodes thereby to reduce low signal level distortion.

13. An amplifier in accordance with claim 12 wherein said control signal comprises the output signal between said collector and said emitter, and said means for applying said control signal to said secondary includes said bypass path and said primary.

14. An electronic amplifier in accordance with claim 11 wherein said variable impedance network comprises a loop consisting of said secondary and a pair of reverse-connected silicon diodes and wherein said means for applying said control signal to said secondary comprises a path between the junction of said diodes and the output of an earlier gain stage of said amplifier, said last-mentioned output constituting said control signal.

15. An electronic amplifier in accordance with claim 11 wherein said variable impedance network comprises a loop consisting of said secondary and a pair of reverse-connected semiconductor diodes and wherein said control signal is derived from the output of a later stage of said amplifier, further amplified, and applied to the junction between said diodes.

References Cited

UNITED STATES PATENTS 3,315,094 4/1967 Mills ------------ 324—478 X

FOREIGN PATENTS 216,799 8/1958 Australia.

ROY LAKE, *Primary Examiner.*

J. B. MULLINS, *Assistant Examiner.*